US005752006A

United States Patent [19]
Baxter

[11] Patent Number: 5,752,006
[45] Date of Patent: May 12, 1998

[54] CONFIGURATION EMULATION OF A PROGRAMMABLE LOGIC DEVICE

[75] Inventor: Glenn A. Baxter, Ben Lomond, Calif.

[73] Assignee: Xilinx, Inc., San Jose, Calif.

[21] Appl. No.: 613,785

[22] Filed: Feb. 29, 1996

Related U.S. Application Data

[63] Continuation-in-part of Ser. No. 594,933, Jan. 31, 1996.
[51] Int. Cl.⁶ .............. G06G 7/48; H03K 19/173
[52] U.S. Cl. .............. 395/500; 364/488; 364/489; 364/578
[58] Field of Search .............. 395/500; 364/488, 364/489, 490, 578; 326/41, 39, 38, 37

[56] References Cited

U.S. PATENT DOCUMENTS

| | | | |
|---|---|---|---|
| 4,901,259 | 2/1990 | Watkins | 364/578 |
| 5,526,278 | 6/1996 | Powell | 364/489 |
| 5,546,562 | 8/1996 | Patel | 364/578 |
| 5,550,839 | 8/1996 | Buch et al. | 364/488 |
| 5,552,722 | 9/1996 | Kean | 326/41 |
| 5,594,367 | 1/1997 | Trimberget et al. | 326/41 |
| 5,596,742 | 1/1997 | Agarwal et al. | 364/489 |
| 5,604,888 | 2/1997 | Kiani-Shabestari et al. | 395/500 |
| 5,649,176 | 7/1997 | Selvidge et al. | 364/489 |
| 5,652,904 | 7/1997 | Trimberger | 395/800 |

FOREIGN PATENT DOCUMENTS

WO 94/20909  9/1994  WIPO.

OTHER PUBLICATIONS

"Emulation of VLSI Devices Using LCAs" by Nick Schmitz, IEEE VLSI Systems Design, May 20, 1987, pp. 54–62.

"In-Circuit Emulation for ASIC-Based Designs" by Pardner Wynn, IEEE VLSI Systems Design, Oct. 1986, pp. 38–44.

"The Hardwire Data Book", 1994, available from Xilinx, Inc., 2100 Logic Drive, San Jose, CA 95124, pp. 2–7 and pp. 2–23 through 2–25.

"The Programmable Logic Data Book", 1994, available from Xilinx, Inc., 2100 Logic Drive, San Jose, CA 95124, pp. 2–25 through 2–46.

"The XC5200 Logic Cell Array Family Technical Booklet", Oct. 1995 (referenced as XC5200™ FPGA Data Sheet) available from Xilinx, Inc., 2100 Logic Drive, San Jose, CA 95124.

Xilinx, Inc., "Hardwire LCAs: A Risk-Free FPGA-to-ASIC Migration Path" by Richard Padovani, IEEE, Nov. 7, 1995, pp. 272–277.

*Primary Examiner*—Vincent N. Trans
*Attorney, Agent, or Firm*—Kent Richardson; Jeanette S. Harms

[57] ABSTRACT

A configuration emulation circuit generates configuration signals to emulate a programmable Logic Device (PLD) in a configuration timing relationship and a configuration protocol relationship between a programming circuit and the PLD. The circuit includes a first circuit to emulate the PLD in the configuration timing relationship. The circuit also includes a second circuit to emulate the PLD in the configuration protocol relationship. The second circuit is coupled to receive a configuration mode signal and is responsive to the configuration mode signal.

5 Claims, 8 Drawing Sheets

5,752,006

CONFIGURATION EMULATION OF A PROGRAMMABLE LOGIC DEVICE

RELATED APPLICATIONS

This application is a continuation-in-part of U.S. patent application Ser. No. 08/594,933 filed Jan. 31, 1996, titled, "Configuration Emulation of a Programmable Logic Device," which is incorporated by reference.

BACKGROUND OF THE INVENTION

1. The Field of the Invention

This invention relates to the field of circuit design. In particular, the invention relates to a circuit and method for maintaining the configuration process in a mask programmed integrated circuit implementation of a circuit design for a programmable logic device.

2. Description of the Related Art

Programmable Logic Devices (PLDs) allow circuit designers to program the PLDs to perform the function of a particular circuit design. Examples of programmable logic devices are Field Programmable Gate Arrays (FPGAs) and Erasable Programmable Logic Devices (EPLDs).

Random Access Memory (RAM) based PLDs use a configuration process to allow a programming circuit to program the PLD to perform the function of a particular circuit design. Non-RAM based PLDs use a similar configuration process. The configuration process uses serial and/or parallel communications between a programming circuit and the PLD. Thus, a configuration timing relationship and a configuration protocol relationship exist between the PLD and the programming circuit. This configuration timing relationship is the time from when power is applied to the PLD to immediately before the PLD is ready to function as the particular circuit design. The configuration protocol relationship is the signalling convention used between the programming circuit and the PLD during the configuration of the PLD.

In an XC4000™ FPGA PLD from Xilinx, Inc., of San Jose, Calif. the configuration mechanism begins after the power supply has reached a certain level (e.g., 3.5 volts). The power reaching a specified level then triggers a specific set of phases. The 1994 Xilinx Data Book, page 2-25 through page 2-31, describes the configuration process for the XC4000 FPGA product family.

In some cases, where the economies of scale warrant, a designer will want to target a circuit design for a different implementation technology. That is, a designer will want to convert a circuit design to a technology (e.g., mask programmed integrated circuit technology) other than in a programmable logic device. A Mask Programmed Integrated Circuit (MPIC) version reduces the silicon area needed to implement the circuit design and is therefore less expensive. This conversion process may be to a simple mask programmed version of the PLD, or a totally different representation; but the user logic functionality is maintained. One example of such a process is described in U.S. Pat. No. 5,550,839 entitled, "Mask-programmed Integrated Circuits Having Timing and Logic Compatibility to User-Configured Logic Arrays".

A MPIC of a PLD does not have a configuration timing relationship nor a configuration protocol relationship because the MPIC is already configured and therefore already programmed. In contrast, the PLD must complete the entire configuration process prior to the commencement of the functional operation of the particular circuit design.

Therefore, one of the problems encountered by designers who convert their circuit designs to another technology is that the configuration timing relationship is not the same for the target technology. A second problem is that the configuration protocol relationship is not maintained. While these two problems may not affect the PLD's circuit design implementation logic functionality, they do affect the integration of the MPIC into the system. If the configuration timing relationship is not maintained, system problems may result that must be solved prior to the introduction of the mask programmed version into the final system. Further, if the configuration protocol relationship is not maintained, the entire system may not become operational. For example, the designer may have to alter the programming circuit or the software that executes in the system. A designer may not want to modify any other part of the system to migrate to a new target technology because this adds additional costs to the design process. The modification of the system may also add to the time it takes to release the system to the market using the target technology. The modification might also introduce the possibility of design mistakes into the system.

One partial solution to the configuration timing relationship problem is to include a power-on reset circuit in the target technology integrated circuit, thereby ensuring that the integrated circuit will be held in a reset state for a period of time until after the applied power becomes stable. This mechanism is referred to as "Power-On-Reset" (POR). However, the POR circuit does not completely solve the problem because the system using the target technology may still have to fully support the remainder of the configuration timing and configuration protocol relationships. If the system was not originally designed to, or is not capable of, supporting POR then the system will have to be redesigned for the target technology.

Xilinx, Inc. produces the XC4300 HardWire™ integrated circuit which supports an alternative configuration mechanism referenced as "Instant-On." This mechanism is documented in the Xilinx HardWire Data Book, page 2-7, page 2-23 through 2-25, 1994. The instant-on feature permits the MPIC to "Power-On " as if the MPIC were already programmed. However, the instant-on feature largely ignores the issues of the configuration protocol relationships.

The Xilinx HardWire Data Book, 1994, also mentions configuration emulation of an FPGA. However, this configuration emulation was a pseudo-emulation of a single configuration mode. The configuration timing relationship was not exactly emulated by the XC4300 HardWire integrated circuit. Further, because only one configuration mode was emulated, the XC4300 HardWire had to be redesigned for each configuration mode that needed to be supported.

Therefore, what is needed is a better solution to both the configuration timing relationship problem and the configuration protocol relationship problem. The solution should reduce, or even remove, the need to redesign the rest of the system.

SUMMARY OF THE INVENTION

A circuit and method of emulating the configuration process of a programmable logic device is described.

In one embodiment, the configuration emulation circuit generates configuration signals to match the configuration protocol relationship. The embodiment maintains a compatibility with the configuration protocol features of the PLD that is being converted. Further, the embodiment emulates multiple configuration modes of a PLD. Specifically, a PLD may have a designer settable option to control what kind of configuration protocol relationship to use during the configuration process. In another embodiment, the configuration emulation circuit also maintains the configuration timing relationship.

In another embodiment, a configuration emulation circuit is included for each configuration mode supported. The embodiment multiplexes the different configuration emulation circuits depending upon the type of configuration mode used by the system, and thereby allowing the embodiment to easily emulate different configuration modes of a PLD.

Another embodiment includes a merged configuration emulation circuit. The merged configuration emulation circuit includes a merged logic block and mode specific logic blocks. The merged logic block includes logic needed to support common functions in the configuration modes supported in the embodiment. The mode specific logic blocks support the functions that are specific to the emulation of a particular configuration mode in the embodiment.

Another embodiment of the invention includes a universal mode configuration emulation logic circuit. The universal mode configuration emulation logic circuit emulates all, or part, of a set of configuration modes for a given family type and device type of PLD.

Another embodiment of the invention includes generating a configuration emulation logic circuit from a description of the universal mode configuration emulation logic circuit. The description includes a parameterized model of the universal mode configuration emulation logic circuit. Compiling the parameterized model with family type and device type parameters generates a single mode, a multi-mode, or a merged mode configuration emulation logic circuit.

Another embodiment of the invention includes generating a timing emulation circuit. The timing emulation circuit causes the embodiment to wait for a period of time corresponding to the configuration timing relationship of the PLD.

Although many details have been included in the description and the figures, the invention is defined by the scope of the claims. Only limitations found in those claims apply to the invention.

BRIEF DESCRIPTION OF THE DRAWINGS

The figures illustrate the invention by way of example, and not limitation. Like references indicate similar elements.

DETAILED DESCRIPTION OF THE DRAWINGS

A System Including A Configuration Emulation Circuit

Figure 1:
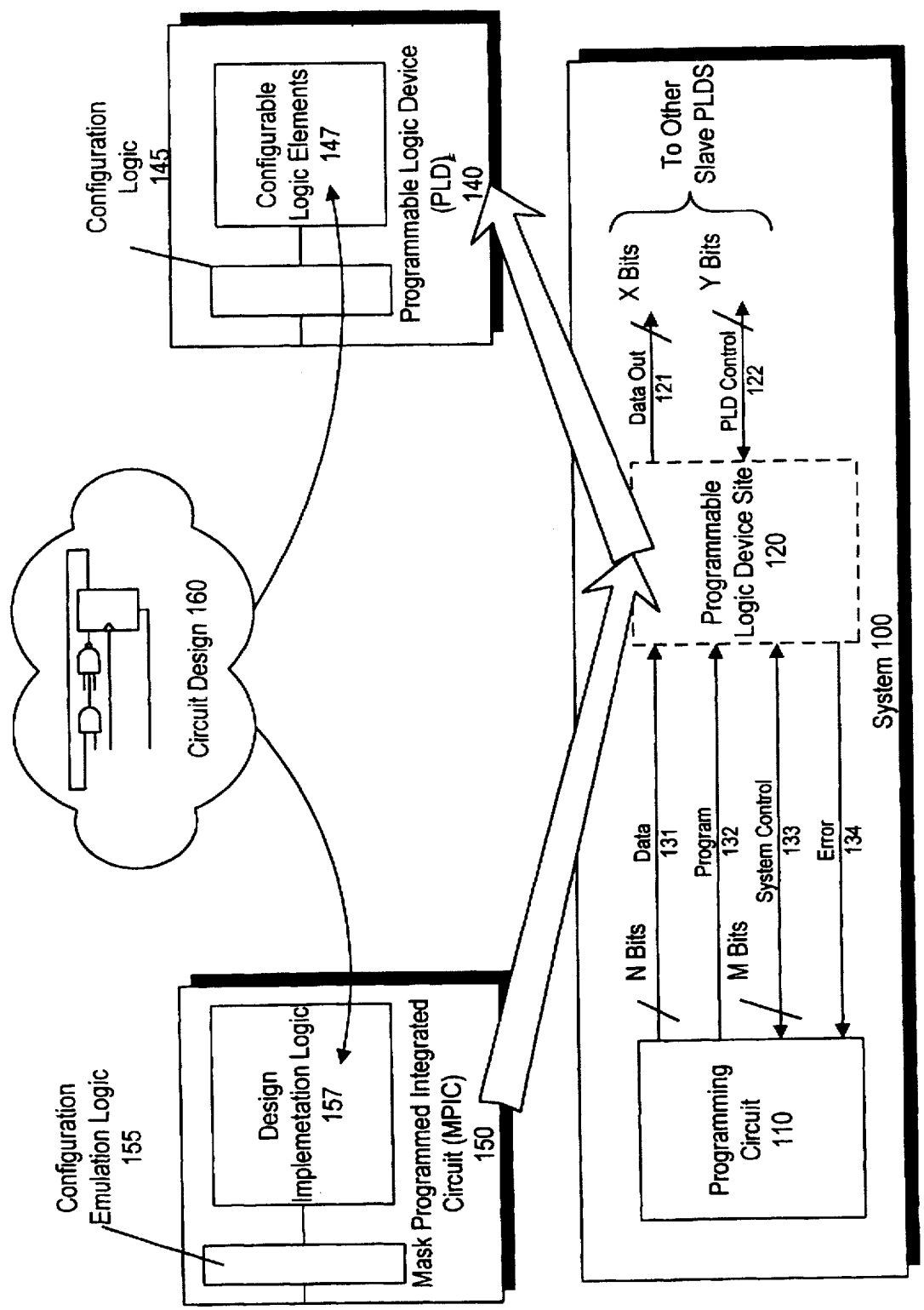
FIG. 1 illustrates a system where a MPIC implementation of a circuit design has been substituted for a PLD.

FIG. 1 illustrates an example system 100 where a programmable logic device (PLD) 140 implementation of a circuit design 160 is being replaced by a mask programmed integrated circuit (MPIC) 150 implementation of the circuit design 160. In the following discussion, the PLD 140 refers to the general class of PLDs and is not specifically restricted to a particular type or family of PLDs.

The system 100 includes a programming circuit 110 which communicates, via a number of busses, with a device mounted in the programmable logic device site 120. The programming circuit 110 generates the configuration data for programming the PLD 140 when the PLD 140 is mounted in the programmable logic device site 120. The programming circuit 110 generates the same configuration data for the MPIC 150 even though the MPIC 150 is already programmed.

In one embodiment, the PLD includes an array of configurable logic elements 147 that are programmed to perform the functions of the circuit design 160. The PLD 140 also includes configuration logic 145. The configuration logic 145 supports the configuration of the PLD 140.

The programming circuit 110 uses the following busses to configure the PLD 140: a data bus 131, a program bus 132, a system control bus 133, and an error bus 134. The programming circuit 110 communicates configuration data via the N bit data bus 131, wherein N is one for serial configuration mode and greater than one for parallel configuration mode. The program bus 132 signals to the device in the programmable logic device site 120 that the programming circuit is to be programmed and in which mode. The M bit system control bus 133 is used during certain types of configuration modes (e.g., an address bus for master parallel mode). The error bus 134 indicates to the programming circuit 110 whether an error has occurred. Additionally, for some modes, the PLD 140 is responsible for programming other PLDs 140. To program these other PLDs 140, the data out bus 121 and the PLD control bus 122 are used by the PLD 140. The configuration timing relationship and the configuration protocol relationship on the busses between the programming circuit 110 and the device mounted in the programmable logic device site 120 are partially determined by the configuration mode used in the system.

One embodiment emulates the following configuration modes of the Xilinx, Inc. XC4000™ FPGA product family: a slave serial mode, a master serial mode, a master parallel up mode, a master parallel down mode, an asynchronous peripheral mode, and a synchronous peripheral mode. The 1994 Xilinx Data Book, page 2-25 through page 2-46, describes the configuration modes for the XC4000™ FPGA product family. Another embodiment supports other configuration modes, such as, express mode (described in the XC5200™ FPGA data sheet from Xilinx, Inc.) and boundary scan. The following briefly describes each of these modes.

The slave serial mode is often used for PLDs 140 that depend on other PLDs 140 for their configuration. For slave serial mode, the PLD 140 accepts configuration data from a single bit wide data bus 131 and retransmits the data via a single bit data out bus 121 as needed. Various control signals are exchanged between the programming circuit 110 and the PLD 140 for controlling the startup function on the system control bus 133 (e.g., DONE, HDC and LDC as described in the 1994 Xilinx Data book at page 2-7 through page 2–46). If an error occurs during the configuration, the PLD 140 communicates the error to the programming circuit 110 on the error bus 134. The slave serial mode requires the programming circuit 110 to strobe the data into the PLD 140 via a configuration clock (part of the system control bus 133).

The master serial mode is often used for the first PLD 140 in a chain of PLDs 140. The chain of PLDs 140 are configured one after another. Additionally, the master serial mode is used where only one PLD 140 is configured. The master serial mode is similar to the slave serial mode except that in master serial mode, the PLD 140 drives a configuration clock signal to other slave devices via the PLD control bus 122 and to the programming circuit 110 via the system control bus 133. In one embodiment, the programming circuit 110 includes a PLD 140 in master serial mode, or another MPIC 150 emulating master serial mode.

The master parallel up mode is used where the programming circuit 110 includes a byte-wide EPROM (Erasable Programmable Read Only Memory). The programming circuit 110 initiates the program mode with the program bus 132. The EPROM is typically dedicated to configuring the PLD 140 but is not required to be. The PLD 140 generates addresses on an address bus (part of the system control bus 133) for the EPROM. Data from the EPROM arrive on the data bus 131.

The master parallel down mode is similar to the master parallel up mode except that the PLD 140 generates addresses starting from the maximum address (e.g., 0xFFFFF) and counts down, instead of starting at the lowest address (e.g., 0x00000) and counting up.

The asynchronous peripheral mode supports an interface with a microprocessor. In the asynchronous peripheral mode, the PLD 140 acts as an asynchronous peripheral to the programming circuit 110. The data bus 131 is bi-directional and is used to send configuration data to the PLD 140 and to read status information from the PLD 140. Configuration errors can be signalled by the PLD 140 by the error bus 134. The synchronous peripheral mode is similar to the asynchronous mode except that the programming circuit 110 drives a configuration clock (on the system control bus 133). The PLD 140 uses a number of control signals on the system control bus to control the flow of data on the data bus 131.

The express mode is used when fast configuration of multiple PLDs 140 is desired. The express mode is a parallel configuration mode for all the PLDs 140 in a chain of PLDs 140. The express mode is similar to the synchronous peripheral mode in that the configuration data is clocked in from the programming circuit 110 synchronously. Data is input to all the devices on the chain via the data inputs of the PLDs 140. A signal from the first PLD 140 in the chain is used by that PLD 140 to tell the next PLD 140 to begin reading the data inputs for its configuration data via the PLD control bus 122.

The IEEE 1149.1 boundary scan Test Access Port of the PLD 140 supports the boundary scan configuration mode. Any output data from the PLD 140 is sent through the internal boundary scan configuration chain of the PLD 140 then out through a Test Data Output pin to the system 100.

Returning to the example of FIG. 1, the PLD 140 is to be substituted by the lower cost MPIC 150. The MPIC 150 includes a design implementation logic 157 and a configuration emulation logic 155. The design implementation logic 157 implements the functions of the circuit design 160 which were previously implemented in the configurable logic elements 147. The configuration emulation logic 155 emulates some, or all, of the configuration logic 145 of the PLD 140. The configuration emulation logic 155 thus provides one embodiment of the invention with the advantage of emulating the configuration modes of a PLD 140. Thus, the MPIC can be directly substituted for the PLD 140 without causing the designer to redesign the system 100.

A Configuration Emulation Circuit

Figure 2A:
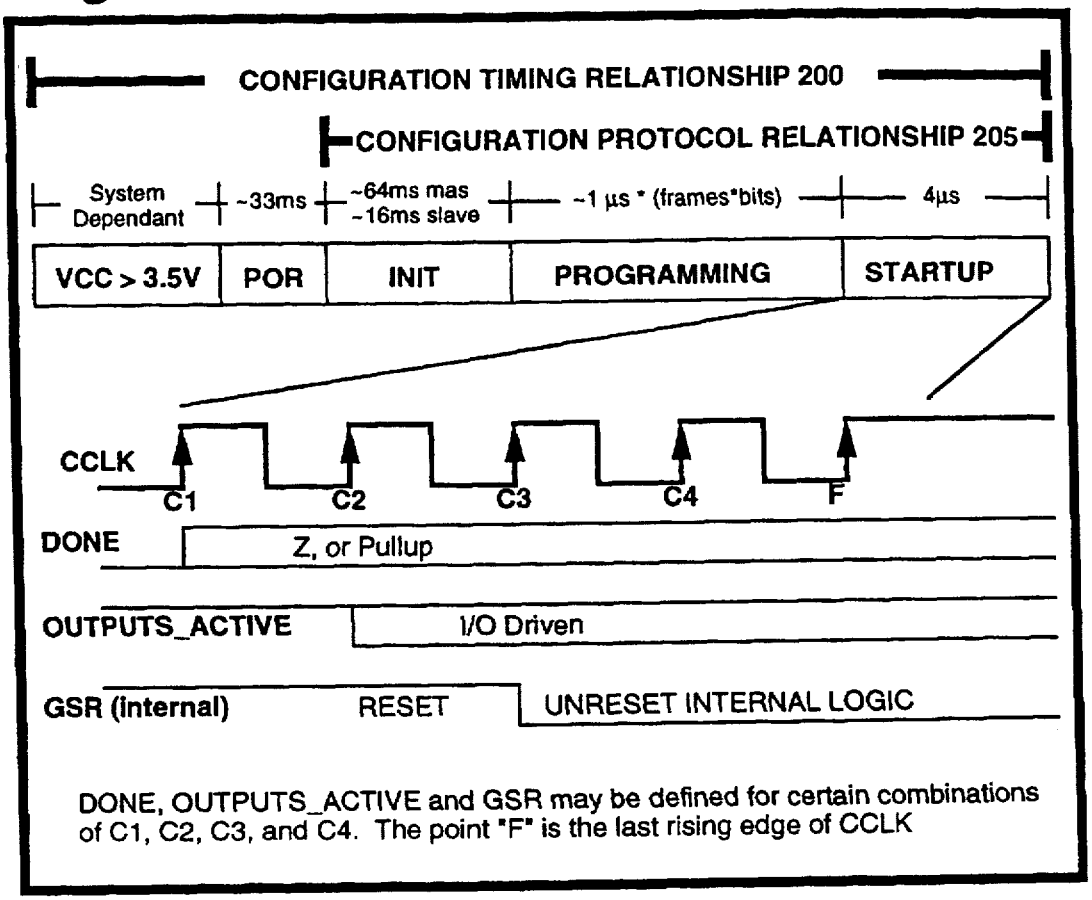
FIGS. 2A and 2B illustrate a configuration emulation circuit and an example of the configuration timing and the configuration protocol relationships of a PLD.
Figure 2B:
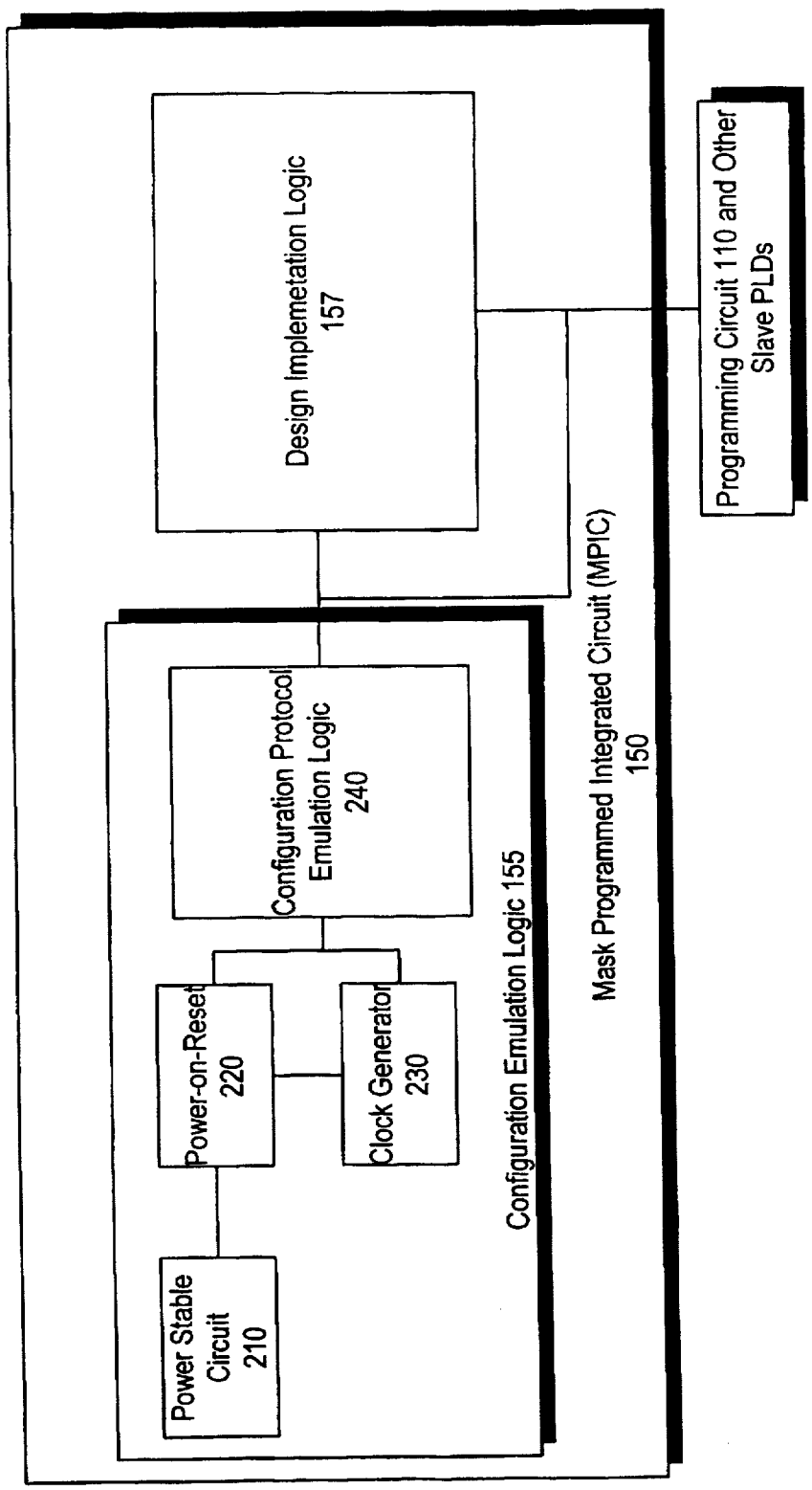

FIGS. 2A and 2B illustrate a more detailed version of the MPIC 150 of FIG. 1 and show the timing and protocol relationships between a PLD 140 and the programming circuit 110 from the power-on phase to the PLD active phase.

In one embodiment, the configuration timing relationship 200 begins from the time that power is applied to the PLD 140 and continues until the PLD 140 is deemed functional (from the perspective of the rest of the system 100). The configuration timing relationship 200 include five time periods, corresponding to the five phases of the configuration process: a period associated with the power rail becoming stable, a period associated with the "Power-on-Reset" circuit, a period for an initialization phase of the PLD 140, a period for programming the PLD 140, and a period associated with the startup synchronization of the PLD 140 with other components in the system 100. The period associated with the power rail becoming stable is the time for the power to reach a stable value. The period associated with the power-on-reset circuit is approximately thirty-three milliseconds but can vary significantly. The initialization period allows the PLD 140 to reset the circuits in the PLD 140 (e.g., the memory devices for the configurable logic elements) and is approximately sixteen milliseconds for slave modes and sixty-four milliseconds for master modes. The configuration period is the period in which the PLD 140 is programmed. For one type of PLD 140, this is one microsecond times the number of frames of configuration data times the number of bits per frame of configuration data. Finally, the startup period is approximately four microseconds and is used to pull up the DONE signal, begin functional operation (OUTPUTS_ACTIVE), and unreset the internal structures of the MPIC 150 (GSR).

In other embodiments, configuration timing relationship includes fewer and/or other configuration emulation phases In accordance with one embodiment of the present invention, the configuration protocol relationship 205 begins at the start of the initialization period and continues until the PLD 140 is deemed functional (from the perspective of the system 100). The configuration protocol relationship 205 represents the communications protocol requirements placed on the PLD 140 by the programming circuit 110 and any other devices that communicate with the PLD 140 during the entire configuration process.

Note that FIG. 2A is a general model that may have fewer or more delay periods depending on the configuration mode used by the PLD 140.

The configuration emulation logic 155 connects to the programming circuit 110, other slave PLDs 140 or MPICs, or other devices, and includes a number of circuits: a power stable circuit 210, a power-on-reset circuit 220, a clock generator 230, and a configuration protocol emulation logic 240. The power stable circuit 210 connects to the power-on-reset circuit 220. The power-on-reset circuit 220 connects to the clock generator 230 and the configuration protocol emulation logic 240. The configuration protocol emulation logic 240 connects to the design implementation logic 157 and communicates over the various busses of FIG. 1 with the programming circuit 110. Collectively, the circuits of the configuration emulation logic 155 emulate the PLD 140's part of the configuration timing relationship 200. Additionally, as part of the configuration emulation logic 155, the configuration protocol emulation logic 240 emulates the PLD 140's part of the configuration protocols with the programming circuit 110 and other system 100 devices.

The power stable circuit 210 ensures that the power source is stable for the MPIC 150. The power stable circuit 210 also emulates the time requirements for the power stable period of the PLD 140.

The power-on-reset circuit 220 performs the functions of the power-on-reset features of the PLD 140. Thus, the power-on-reset circuit 220 emulates the timing requirements for the power-on-reset period of the PLD 140. The power-on-reset circuit 220 also provides reset signals to the clock generator 230.

The clock generator 230 provides clock signals to the configuration protocol emulation logic 240. The clock generator 230 also provides clock signals to other slave devices over the PLD control bus 122.

The configuration protocol emulation logic 240 emulates the configuration protocol responsibilities of a PLD 140 (during the configuration protocol relationship 205). In one embodiment, the configuration protocol emulation logic 240 permits multiple configuration emulation modes to exist. For example, one MPIC 150 can support multiple configuration modes of a PLD 140, thereby allowing designers to use the same MPIC 150 design in different configuration modes in the system 100. For example, assume two PLDs 140 are to be replaced by two MPICs 150. Also assume that each of the two PLDs 140 includes the same circuit design 160 and that the first PLD 140 operates in master serial mode, while the second PLD 140 operates in slave serial mode. By supporting multiple configuration modes in the configuration emulation logic 155, only one design of the replacement MPIC 150 need be fabricated. One MPIC 150 replaces the master serial mode PLD 140 and a second copy of the same MPIC 150 replaces the slave serial mode PLD 140. Similarly, the same circuit design 160 may be implemented in PLDs 140 in different systems 100. For example, one system 100 uses the PLD 140 in master serial mode, while another system 100 uses the PLD 140 in asynchronous peripheral mode. Because the configuration protocol emulation logic 240 supports multiple configuration modes, only one MPIC 150 need be fabricated. The new MPIC 150 can be used in either system without having to change either system.

In one embodiment of the invention, where only a subset of the configuration timing relationship 200 and/or the configuration protocol relationship need be maintained by the MPIC 150, elements of the configuration emulation logic 155 are not included. For example, where the MPIC 150 need only maintain the configuration protocol relationship 205 with the MPIC 150, the configuration emulation logic 155 may not include the POR 220 circuit. In another embodiment, where the system 100 need not wait for the entire programming step, the elements that support the programming step are not included in the configuration logic 155 (this also significantly decreases the time required to "configure" the MPIC 150 in the system 100, and reduces the area required to implement the configuration logic 155).

A Multiplexed Mode Configuration Emulation Circuit

Figure 3:
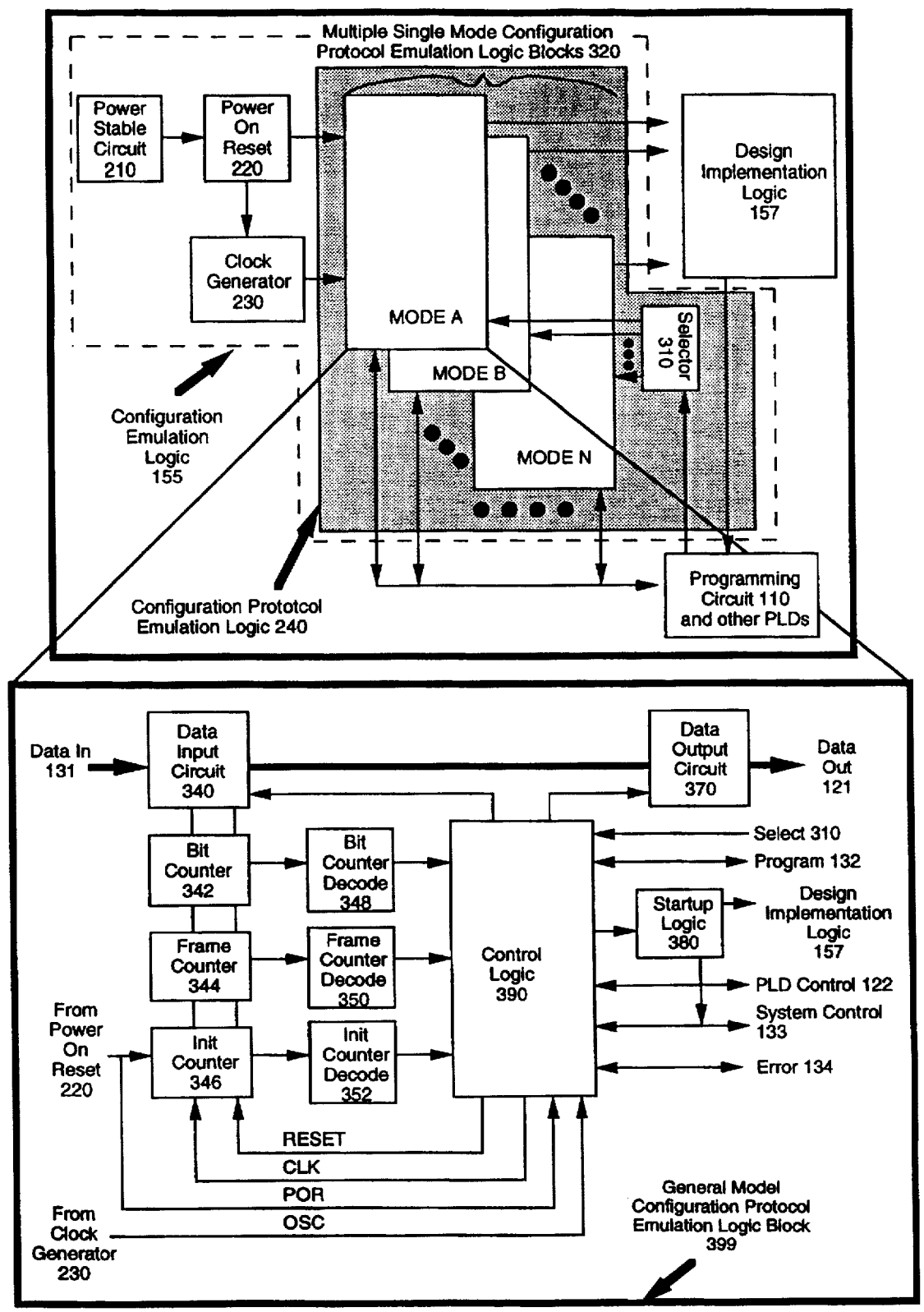
FIG. 3 illustrates a multiplexed mode configuration emulation circuit.

FIG. 3 illustrates an embodiment that emulates multiple configuration modes of a PLD 140. The configuration protocol emulation logic 240 of FIG. 3 includes multiple single mode configuration protocol emulation logic blocks 320. A selector 310 determines which mode is required by the programming circuit 110, then enables the appropriate corresponding logic block of the multiple single mode configuration protocol emulation logic blocks 320.

Each of the single mode emulation logic blocks emulates the configuration protocol responsibilities of a PLD 140 for a single configuration mode. For example, one single mode configuration protocol emulation logic block emulates slave serial mode, wherein another single mode configuration protocol emulation logic block emulates the configuration protocols for the master parallel up mode.

FIG. 3 includes a general model of a single mode configuration protocol emulation logic block 399. The block 399 includes the following circuits: a data input circuit 340, a bit counter 342, a bit counter decoder 348, a frame counter 344, a frame counter decoder 350, an init counter 346, an init counter decoder 352, a control logic 390, a startup logic 380 and a data output circuit 370. The control logic 390 connects to all of the other above referenced circuits and communicates information (e.g., INIT, and OSC-the output of the clock generator 230) with the programming circuit 110. The data input circuit 340 receives data from data bus 131 and communicates the data to the data output circuit 370. The data output circuit 370 controls the connection to the data out bus 121. Each of the decoders are connected to their corresponding counters and the control logic 390. The startup logic 380 connects to the design implementation logic 157 and the control logic 390.

Under the control of the control logic 390, the data input circuit 340 and the data output circuit 370, depending upon the specific mode, process serial or parallel data. In one embodiment, the data input circuit 340 includes a single D flip-flop for a bit from a serial stream of bits. In another embodiment, the data input circuit 340 includes an eight bit register to hold parallel data.

The init counter 346 counts the time needed for the initialization period. Thus, the init counter 346 is partially responsible for maintaining the configuration timing relationship 200 from a PLD 140 perspective.

The frame counter 344 and the bit counter 342 work together to count the number of frames and bits in an embodiment of the invention that emulates configuration modes of an FPGA, or similar PLD, that is programmed by frames and bits. The bit counter 342 counts the number of bits in a frame while the frame counter 344 counts the number of frames in the program data received from the programming circuit 110. In one embodiment, where header and footer bits are transmitted as part of the configuration data, these counters take into account these additional bits. The frame counter 344 and the bit counter 342 with the other circuits of the configuration emulation logic 155 emulate the PLD 140 in the configuration protocol relationship 205 during the programming period of the configuration timing relationship 200.

The startup logic 380 emulates the PLD 140's protocol for the startup period of the configuration protocol relationship 205 and completes the configuration timing relationship 200. The startup logic 380 generates signals (e.g., DONE, HDC and LDC) via the system control bus 133 to indicate to the programming circuit 110 that the emulated PLD 140's configuration process is complete.

The control logic 390 controls the circuits within the general model of a single mode configuration protocol emulation logic block 399. The control logic 390 provides clocks, clock enables, and resets for all the counters (e.g., CLK and RESET), controls the serialization of data (when dictated by the mode), manipulates the output data, handles counting the number of program bits read, and determines when the last programmed data bit has been read from the programming circuit 110.

The following describes a specific mode configuration protocol emulation logic block for the master serial mode of the XC4010™ FPGA. The total programming data stream, for a single XC4010 FPGA PLD 140, includes a forty bit header, a programming data segment of 226*788=178,088 bits (organized as 226 bits/frame and 788 frames), followed by an eight bit footer (described at page 2-26 of the 1994 Xilinx data book). Thus, there are a total of 178,136 bits that must be accounted for in the programming period of FIG. 2. The XC4010 FPGA supports connecting the FPGA in a chain to create a single data stream from the programming circuit 110 to the all the FPGAs in the chain. To support the chaining, the FPGAs need to retransmit the header to all the FPGAs in the chain. This header is the first forty bits of the data stream. Therefore, the control logic 390 ensures that the first forty bits of the configuration data are sent out by the data output circuit 370. Further, once the programming data segment for the FPGA being replaced by the particular MPIC 150 is received, the control logic 390 causes any remaining configuration data received at the data input circuit 340 to be transmitted out by the data output circuit 370. The init counter 346 is set to count for approximately 1.0234 milliseconds (approximately 1.3 643 microseconds times the number of frames 788). The bit counter decoder 348 is set to decode a count of 226 bits. The frame counter decoder 350 is set to decode 788 frames. The control logic 390 includes addition counters to implement the state machines to provide timing and signalling conventions of the configuration protocol.

In one embodiment, the configuration protocol emulation logic 240 includes a multiple single mode configuration protocol emulation logic blocks 320 for all of the configuration modes of the XC4000 FPGA family. This embodiment allows the MPIC 150 to be interchanged with the PLD 140 regardless of the configuration mode used by the programming circuit 110.

In another embodiment, to save silicon area, only selected configuration modes are supported in the MPIC 150. Note that since each of the single mode configuration protocol emulation logic blocks is unique to its mode, some of the single mode emulation logic blocks will be larger than others. Consider, for example, the slave serial mode and the master parallel down mode in the XC4000 FPGA. The slave serial configuration emulation mode has a single serial path for the data bus between the data bus 131 and the data out bus 121. However, the same path for the master parallel down mode configuration emulation logic block has many additional elements because the data is eight bit parallel in and out. Thus, the master parallel down mode emulation logic block uses more silicon area than the slave serial emulation logic block. In one version of this embodiment, to further save silicon area, only a single configuration mode is supported in the MPIC 150. In this version, the selector 310 is not needed because only the one configuration mode is supported, further saving silicon area.

A Merged Mode Configuration Emulation Circuit

Figure 4:
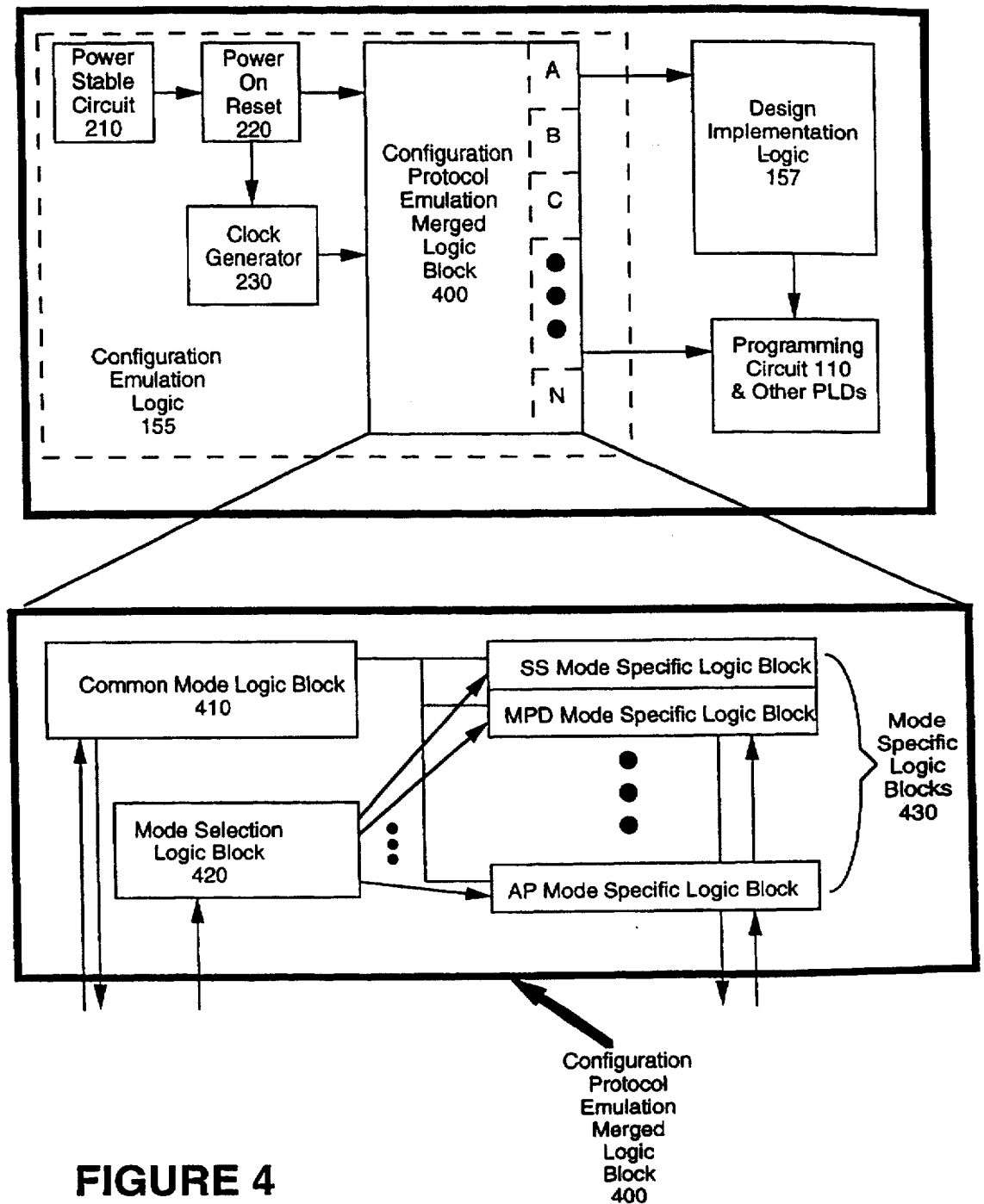
FIG. 4 illustrates a merged mode configuration emulation circuit.

FIG. 4 illustrates an embodiment that emulates multiple configuration modes of a PLD 140 using a configuration protocol emulation merged logic block 400. The merged logic block 400 replaces the multiplexed mode configuration protocol logic 240 of FIG. 3.

The merged logic block 400 groups common logic functions of different configuration modes into a single common mode logic block 410. The merged logic block 400 includes a common mode logic block 410, a mode selection logic block 420, and a number of mode specific logic blocks 430. The common mode logic block 410 communicates with the mode specific logic blocks 430, the design implementation logic 157, the programming circuit 110 and other PLDs. The mode selection logic block 420 enables one of the mode specific logic blocks 430 in response to a specific configuration mode.

The merged logic block 400 also expands the function of the control logic 390 to support the common mode logic block and the specific mode logic blocks. The merged logic block 400 reduces the silicon area used to support an equivalent number of modes in the MPIC 150 of FIG. 3 by commonly sharing the resources required to emulate the configuration protocol relationship. For example, if the merged logic block 400 supports three configuration modes, substantial silicon area can be saved by sharing the bit counter 342, the frame counter 344 and the init counter 346 circuits in the common mode logic block 410.

In one embodiment, the mode specific logic blocks 430 include logic to emulate the following configuration modes: slave serial, master serial, master parallel up, master parallel down, asynchronous peripheral, and synchronous peripheral. In another embodiment, the mode specific logic blocks emulate the boundary scan, and express modes. In other embodiments, the mode specific logic blocks 430 emulate specific configuration timing relationship and protocol relationships during the init phase, the programming phase and the startup phase of the PLD 140. Also, as noted above, the merged logic block 400 can support a subset of the configuration modes of the PLD 140. For example, in one embodiment, the merged logic block 400 emulates slave serial and master serial modes. Thus, the mode specific logic blocks 430 includes only two mode specific logic blocks.

A Universal Mode Configuration Emulation Circuit

Figure 5:
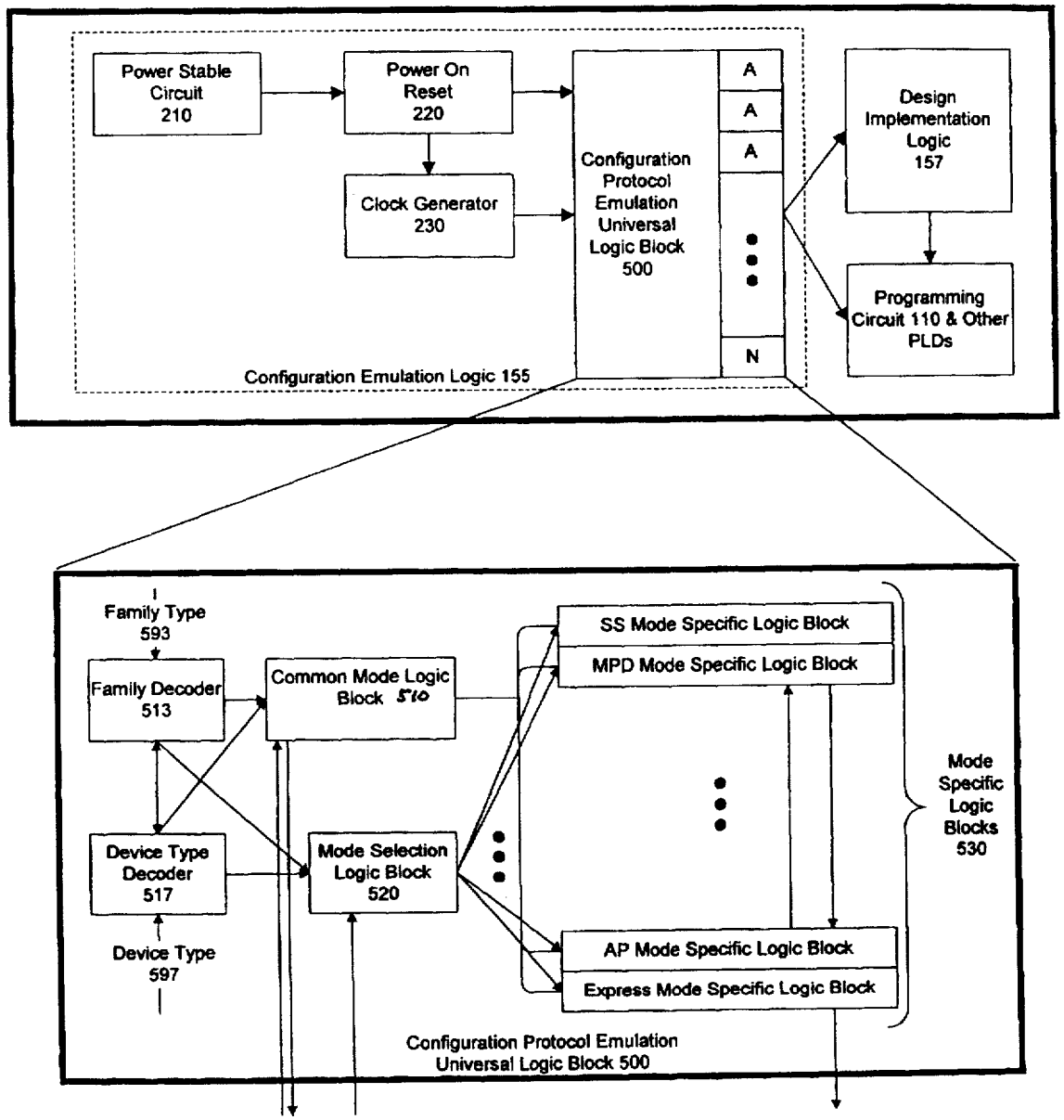
FIG. 5 illustrates a universal mode configuration emulation circuit.

FIG. 5 illustrates an embodiment of the invention that emulates multiple configuration modes of a number of families of PLDs 140 (FIG. 1) using a configuration protocol emulation universal logic block 500. The universal logic block 500 replaces the multiplexed mode configuration protocol emulation logic 240 of FIG. 3 and/or the configuration protocol emulation merged logic block 400 of FIG. 4.

Some PLDs 140 are manufactured as a family of PLDs 140. For example, Xilinx, Inc. produces the XC5000™ series, the XC4000™ series and the XC3000™ series FPGAs. Some families support different configuration modes from other families. The universal logic block 500 supports the various configuration modes of these different families. In addition to different families of PLDs 140, different family members, referred to as different device types, are sometimes manufactured. For example, within the XC4000™ series FPGAs, twelve different family members exist. That is, the XC4000 series FPGAs include twelve different device types. Different device types have different numbers of bits per frame and different numbers of frames in the programming portion of the configuration protocol relationship 205 (FIG. 2A). Of course, the family type and the device type can determine other aspects of the configuration timing relationship 200 and/or the configuration protocol relationship 205 (e.g., the startup duration, the programming duration, the init duration, the power on reset duration). By supporting various family types and device types, the universal logic block 500 can be used in MPIC 150 to emulate one of many different configuration modes of PLD's 140. In one embodiment, the universal logic block 500 is implemented as a mask programmable library cell. A designer can include the library cell in any MPIC 150 implementation of any PLD 140. By tying the appropriate inputs of the library cell to the appropriate logic levels, the designer can specify which configuration mode(s) of which PLD 140 family type and device type the universal logic block 500 is to emulate. Thus, the designer does not have to create a different universal logic block 500 library cell for each PLD 140 device type of each family.

The universal logic block 500 includes a family decoder 513, and a device type decoder 517, in addition to a common mode logic block 510, a mode selection logic block 520 and a number of mode specific logic blocks 530. During the manufacturing of the MPIC 150, the family decoder 513 and the device type decoder 517 are statically connected (e.g., through a metal mask programming step during the manufacturing of the MPIC 150) to logic levels that represent the family type 593 and the device type 597 of the PLD 140. The family decoder 513, using the family type 593, indicates to the common mode logic block 510 and the mode selection logic block 520 which set of the mode specific logic blocks 510 are available for the family type 593. The family decoder 513 also indicates other family type related information such as information pertaining to the startup protocol relationships. The family type 593 can be implemented either with a single signal per PLD family type, or by a set of signals (one per configuration emulation mode) to indicate which configuration emulation mode(s) are to be available for the specific implementation of the configuration emulation logic 155 in the MPIC 150. Thus, the universal logic block 500 can support any combination of multiple configuration emulation mode(s) or even a single configuration emulation mode. The device type decoder 517, using the device type 597 and information from the family decoder 513, indicates, to the common mode logic block 510, how many bits per frame and how many frames are to be included in the programming portion of the configuration protocol relationship 205. The device type decoder 517 also communicates information to the mode selection logic block 520 such as the asynchronous or synchronous nature of a mode specific logic block 530. The common mode logic block 510, once given the set of mode specific logic blocks available for the family type, operates similarly to the common mode logic block 410. The mode selection logic block 520, once given the set of mode specific logic blocks for the given family type, operates similarly to the mode selection logic blocks 420.

In one embodiment, the family type 593 and the device type 597 are determined from a single device type 597 specification. For example, in this embodiment, if the device type is an XC4003 ™ FPGA, then the family type 593 is inherently the XC4000™ family.

Generating a Configuration Emulation Circuit

Figure 6:
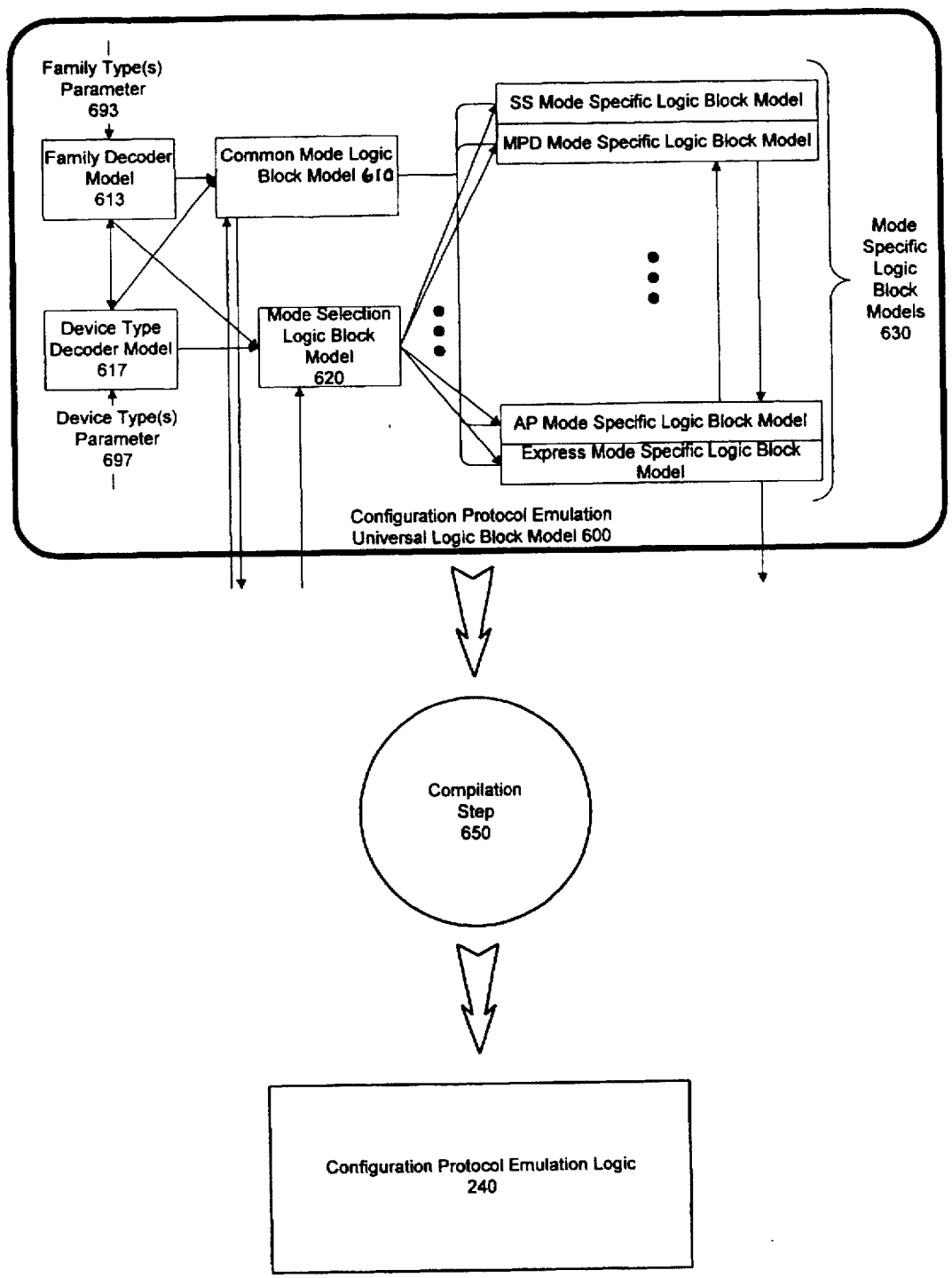
FIG. 6 illustrates generating a configuration emulation circuit using family type and device type characteristics.

FIG. 6 illustrates generating a configuration emulation circuit using family type and device type characteristics. A configuration protocol emulation universal logic block model 600 is parameterized with the family type parameter 693 and the device type parameter 697 to generate the configuration protocol emulation logic 240.

The logic block model 600 is a compilable description of the universal logic block 500. Such a description, in one embodiment, includes a netlist description of the universal logic block 500. In another embodiment, the description is a high level language (e.g., Verilog or VHDL) description of the logic block 500. In one embodiment, the logic block model 600 corresponds to a parameterized macro. The parameters of the macro are set by a designer to select which family type(s) and/or device type(s) are to be supported the MPIC 150.

The logic block model 600 is compiled, in the compilation step 650, to generate the configuration protocol emulation logic 240. In one embodiment, this is done using a synthesis tool, such as is available from Synopsys, Inc. of Mountain View, Calif. The compilation step removes the portions of the logic block model 600 that are not needed to implement the specified family type(s) and/or device type(s) (e.g. Various logic elements used to create the common mode logic block model 610, and/or the mode selection logic block model 620, and/or the mode specific logic block models 630. For example, if the family type specified is an XC4000 family, and the device type is an XC4005™ FPGA, then the configuration protocol emulation logic 240 will include only the logic needed to emulate the configuration mode(s) of the XC4005 device. In one embodiment, the resulting configuration protocol emulation logic 240 includes a multiple single mode configuration protocol emulation logic blocks 320. In another embodiment, the resulting configuration protocol emulation logic 240 includes a configuration protocol emulation merged logic block 400.

In another embodiment of the invention, the logic block model 600 includes parameters for selecting which configuration modes for a particular family type and device type will be supported. For example, if the designer specifies the XC4000 FPGA family, and the XC4005 device type, then the designer can also specify that only the slave serial and the asynchronous peripheral mode are to be supported by the MPIC 150.

By using the logic block model 600, a designer can quickly and easily generate a configuration protocol emulation circuit 240 for use in an MPIC 150.

A Configuration Timing Emulation Circuit

Figure 7:
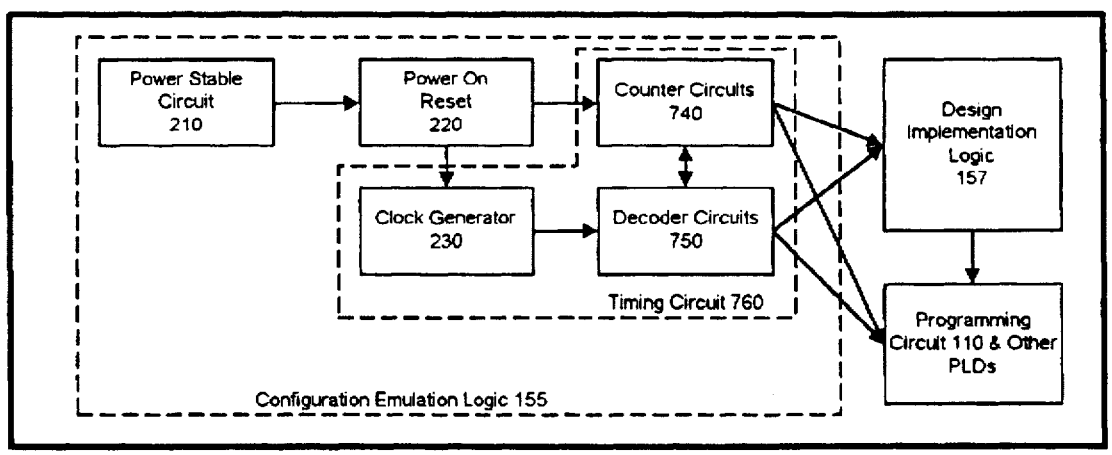
FIG. 7 illustrates a configuration timing emulation circuit.

FIG. 7 illustrates a configuration timing emulation circuit. As noted above, in one embodiment of the invention, only a portion of the configuration timing relationship 200 and the configuration protocol relationship 205 is supported by the MPIC 150. In the embodiment of FIG. 7, only the time delay of the timing protocol relationship 200 is emulated by the MPIC 150.

The embodiment of FIG. 7 is similar to that of FIG. 2 except that the configuration protocol emulation logic 240 is replaced by the counter circuits 740 and the decode circuits 750. The counter circuits 740 simply counts for a period required for each step in the configuration timing relationship 200. The decoder circuits 750 controls the counting of the counter circuits 740. Thus, in one embodiment of the invention of FIG. 7, the configuration emulation logic 155 effectively ignores the signals from the system 100 until the time period for the timing relationship 200 has expired.

In another embodiment of FIG. 7, the clock generator 230 and/or, the counter circuits 740, and/or the decoder circuits 750 is replaced with a timing circuit 760. The timing circuit 760 includes electronics to wait a predetermined period of time. In one embodiment, the timing circuit 760 includes an RC time constant circuit.

In another embodiment, the timing circuit 760 includes only the clock generator 230. The clock generator 230 causes an appropriate delay (based upon when the first clock edge is generated) corresponding to the remainder of the configuration timing relationship 200 from the power on reset period. In this embodiment, the counter circuits 740 and decoder circuits 750 are not required.

A configuration emulation circuit and method have been described. One embodiment of the invention allows a mask programmed integrated circuit of a circuit design to emulate configuration modes of a PLD. Thus, a designer can substitute the mask programmed integrated circuit into a system that used a PLD without having to redesign the system. In one embodiment, one of a number of single mode configuration emulation logic blocks are enabled based on signals received from a programming circuit. In another embodiment that also emulates multiple modes, logic that is common to the modes is shared to reduce the silicon area used by the emulation circuit. In another embodiment, PLD 140 family types and device types are used to mask program a universal configuration emulation logic block. The universal configuration emulation logic block allows a designer to easily specify which PLD family and device type emulation modes are to be emulated by the MPIC. In one embodiment of the invention, a parameterized description of the universal logic block is used to generate the configuration protocol logic. A compiler removes the elements of the description that are not needed to implement the specific family type, device type, and/or set of configuration modes, in a given configuration protocol emulation logic 240. In one embodiment, the configuration emulation circuit allows the MPIC 150 to emulate only the configuration timing relationship 200, or a portion thereof.

I claim:

1. A circuit for emulating a configuration timing relationship and a configuration protocol relationship between a programmable Logic Device (PLD) and a programming circuit, said programming circuit using a configuration mode signal to said PLD to establish said configuration timing relationship and said configuration protocol relationship, said circuit comprising:

a first circuit to emulate said PLD in said configuration timing relationship; and a second circuit to emulate said PLD in said configuration protocol relationship, said second circuit being coupled to said first circuit and being coupled to receive said configuration mode signal, and wherein said second circuit is responsive to said configuration mode signal, said second circuit further configured to emulate said PLD in a second configuration protocol relationship responsive to a second configuration mode signal.

2. The circuit of claim 1 wherein said first circuit includes a power stable circuit and a power on reset circuit, said power stable circuit indicating a stable power supply to said circuit, said power on reset circuit to reset said circuit responsive to said power stable circuit.

3. The circuit of claim 1 wherein said second circuit includes a PLD family type and a PLD device type specified configuration protocol emulation circuit, said PLD family type and said PLD device type defining a set of configuration modes to be emulated and a set of configuration programming characteristics.

4. The circuit of claim 3 wherein said set of configuration programming characteristics includes a number of bits per frame characteristic and a number of frames characteristic.

5. The circuit of claim 3 wherein said family type is included in and is defined by said device type.

* * * * *